United States Patent
Koduri

[11] Patent Number: 5,996,877
[45] Date of Patent: Dec. 7, 1999

[54] STEPWISE AUTOROTATION OF WIRE BONDING CAPILLARY

[75] Inventor: Sreenivasan K. Koduri, Dallas, Tex.

[73] Assignee: Texas Instruments Incorporated, Dallas, Tex.

[21] Appl. No.: 08/992,270

[22] Filed: Dec. 17, 1997

Related U.S. Application Data

[60] Provisional application No. 60/033,483, Dec. 19, 1996.

[51] Int. Cl.$^6$ .............................. B23K 37/00; B23K 1/06; B23K 3/02
[52] U.S. Cl. .............................. 228/4.5; 228/1.1; 228/55; 228/110.1; 228/180.5
[58] Field of Search ................................... 228/180.5, 4.5, 228/110.1, 55, 102, 1.1, 8; 310/328; 156/73.2, 580.1

[56] References Cited

U.S. PATENT DOCUMENTS

| | | | |
|---|---|---|---|
| 3,941,294 | 3/1976 | Johannsmeier | 228/4.5 |
| 4,821,945 | 4/1989 | Chase et al. | 228/179 |
| 4,870,743 | 10/1989 | Gilmore | 29/568 |
| 5,326,014 | 7/1994 | Morita et al. | 228/110.1 |
| 5,368,216 | 11/1994 | Sakakura et al. | 228/1.1 |
| 5,544,804 | 8/1996 | Test et al. | 228/180 |
| 5,829,663 | 11/1998 | Khelemsky et al. | 228/1.1 |

FOREIGN PATENT DOCUMENTS 403250640  11/1991  Japan.
405090321  4/1993  Japan.

*Primary Examiner*—Patrick Ryan
*Assistant Examiner*—Kiley Stoner
*Attorney, Agent, or Firm*—Wade James Brady, III; Richard L. Donaldson

[57] ABSTRACT

A rotation device (100) provides precise, stepwise rotation of a wire bonding capillary (10) about the longitudinal axis of the capillary. This enables the capillary (10) to be rotated to different angular alignments to perform wire bonding in different directions. The rotation device (100) can be a click ring-type device, a cam-type device or any other device to provide stepwise rotation. At least a part of the rotation device (100) is coupled to the capillary (10). Another part of the rotation device is separate from the capillary but engageable with the first part to provide rotation. Indicators may be positioned on the capillary to provide signals to detectors. The signals can be used to initially align the capillary and to realign the capillary during wire bonding. A computer may be used to provide automated control of the indicators and detectors, and automated rotation of the rotation device.

12 Claims, 5 Drawing Sheets

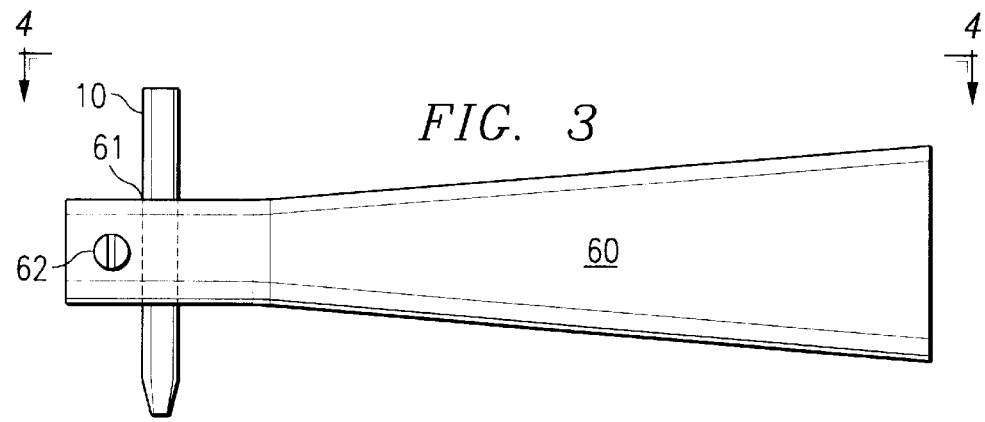
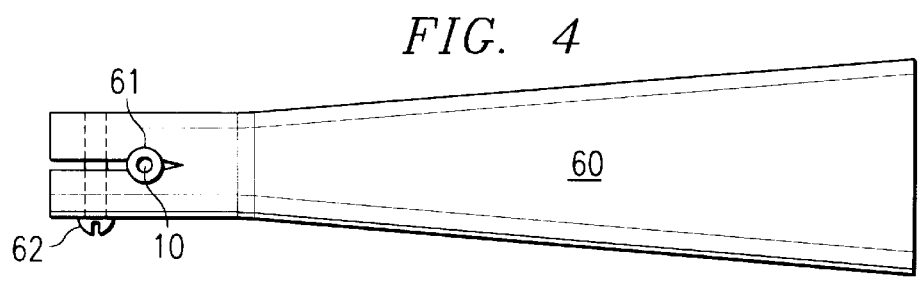
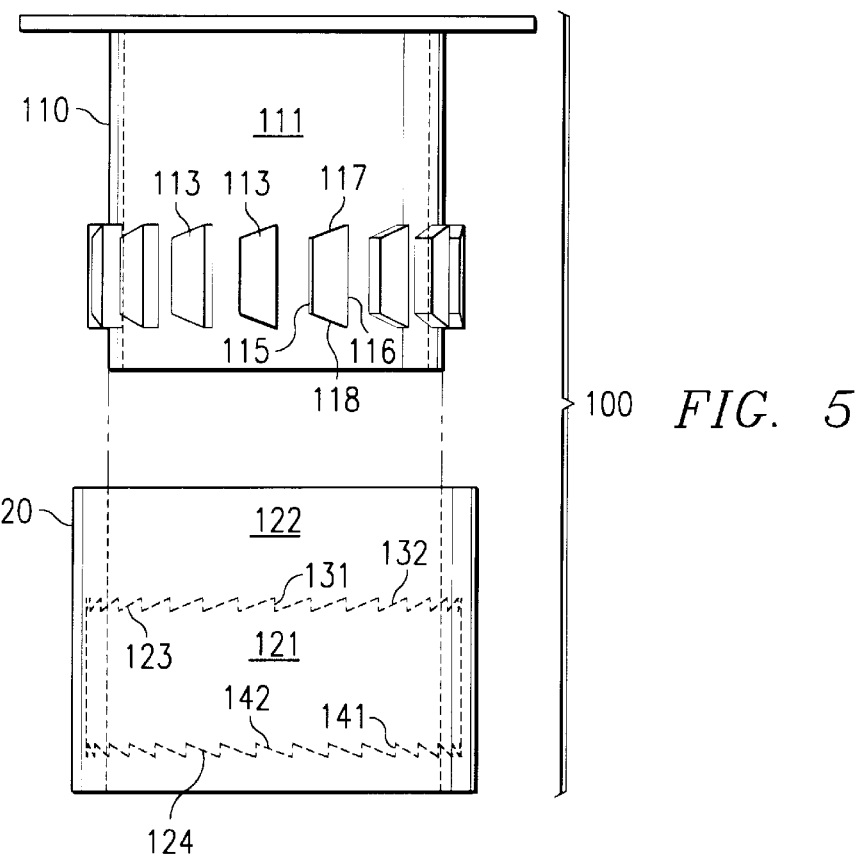

1

STEPWISE AUTOROTATION OF WIRE BONDING CAPILLARY

This application claims priority under 35 USC § 119(e)(1) of Provisional Application No. 60/033,483 filed Dec. 19, 1996.

TECHNICAL FIELD OF THE INVENTION

The present invention generally relates to a wire bonding process and capillaries used in the wire bonding process during the manufacture of electronic integrated circuit chip packages and, more particularly, to stepwise autorotation of wire bonding capillaries.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with capillaries used in wire bonding.

It is a further object of the present invention to address the needs associated with wire bonding techniques.

It is a further object of the present invention to provide a capillary for a wire bonding machine which may be easily aligned during installation of the capillary into the wire bonding machine.

It is a further object of the present invention to provide a capillary for wire bonding which may be easily aligned and realigned during the wire bonding process.

It is a further object of the present invention to provide a capillary, the alignment of which may be easily established and/or checked during use of the capillary.

It is a further object of the present invention to provide automated, stepwise rotation of wire bonding capillaries.

To accomplish these and other objects of the present invention, a rotation device is provided for imparting stepwise rotation to a wire bonding capillary. In a first embodiment, the device includes a first part adapted to be coupled to the capillary and a second part engageable with the first part to impart stepwise rotation to the capillary.

According to one aspect the first part is a first rotation element and the second part is a second rotation element. The first and second rotation elements may form a click ring. The first and second rotation elements may form a cam-roller device.

According to another aspect, a wire bonding capillary includes a tubular body portion and a first rotation element coupled to the tubular body portion. The first rotation element is engageable with a second rotation element to impart stepwise rotation to the capillary.

According to another embodiment, a wire bonding machine includes a horn and a capillary rotatably mounted on the horn. A rotation device is at least partially coupled to the capillary and adapted to impart stepwise rotation to the capillary.

According to another embodiment a method of wire bonding is provided. A capillary face is aligned along a first direction. The capillary is used to make a first wire bond. The capillary face is realigned along a second direction. The capillary is used to make a second wire bond. Realignment may be accomplished by rotating the capillary in a stepwise manner.

BRIEF DESCRIPTION OF THE DRAWINGS

For a more complete understanding of the present invention and for further features and advantages, reference is now made to the following description taken in conjunction with the accompanying drawings, in which:

FIG. 3 is a horn of a wire bonding machine;

FIG. 4 is a cross section of the horn of FIG. 3 taken along line 4—4 of FIG. 3;

FIG. 5 is a rotation device in accordance with a first embodiment of the present invention;

DETAILED DESCRIPTION OF THE INVENTION

Figure 1:
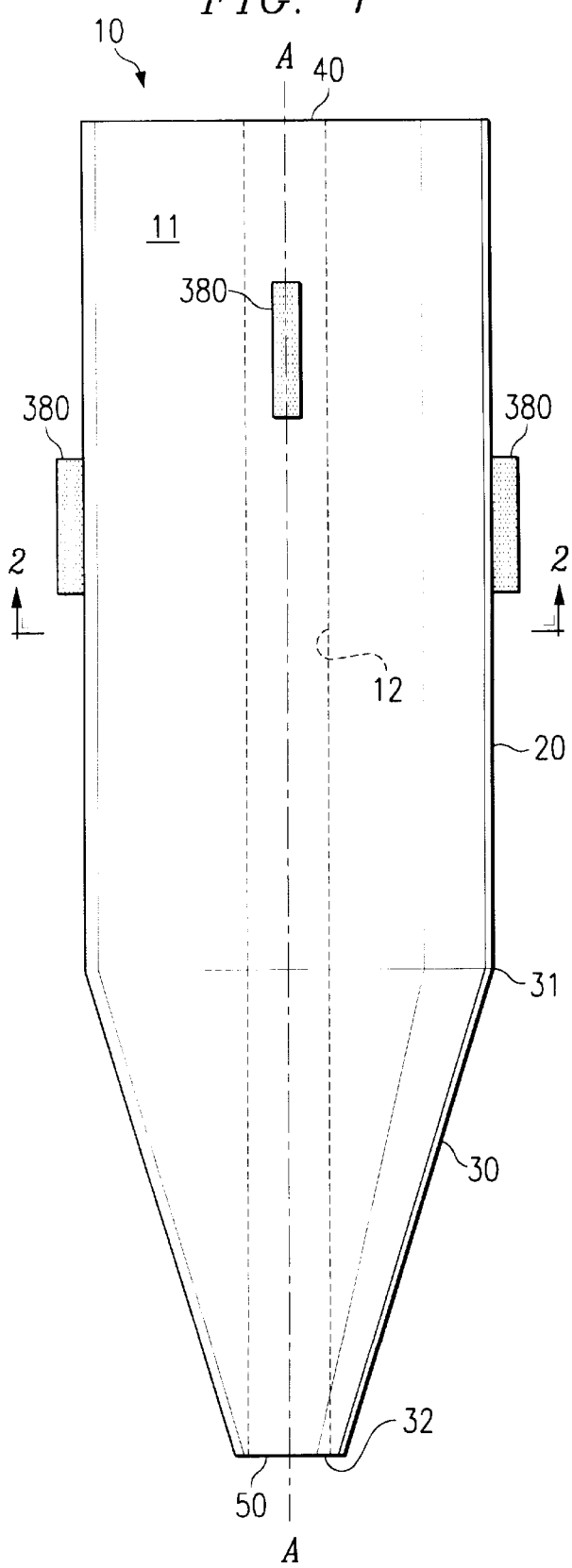
FIG. 1 is an elevation view of a wire bonding capillary.

Wire bonding machines are generally known. A typical wire bonding machine includes a spool of bonding wire which may comprise any suitable bonding material such as gold. The bonding wire is fed through a guide which is generally known as a capillary. This capillary also acts as the bonding tool. The capillary may be mounted on an arm of the wire bonding machine known as a horn. The present invention, among other things, contemplates rotatably mounting the capillary on the horn and providing a device which enables stepwise rotation of the capillary about its longitudinal axis. If the capillary is precisely aligned according to an initial alignment (e.g., upon installation of the capillary onto the horn), then the stepwise movement of the capillary ensures rotation of the capillary by precise angular amounts.

A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 08/993,638 which is assigned to Texas Instruments Incorporated. This application was filed on Dec. 19, 1996 and is hereby incorporated by reference for all purposes.

The present invention provides stepwise rotation of the capillary. This may either supplement or replace the use of indicators and detectors. As shown in greater detail in FIG. 1, capillary 10 has a tubular body comprising a shaft portion 20 which is integral with a tip portion 30. The capillary has a longitudinal bore extending through its interior along the general direction of longitudinal axis AA. The longitudinal bore of capillary 10 has an entry end 40 and an exit end 50. Bonding wire may be inserted into entry end 40 to extend through the interior of capillary 10 and exit from capillary 10 through exit end 50.

Figure 2:
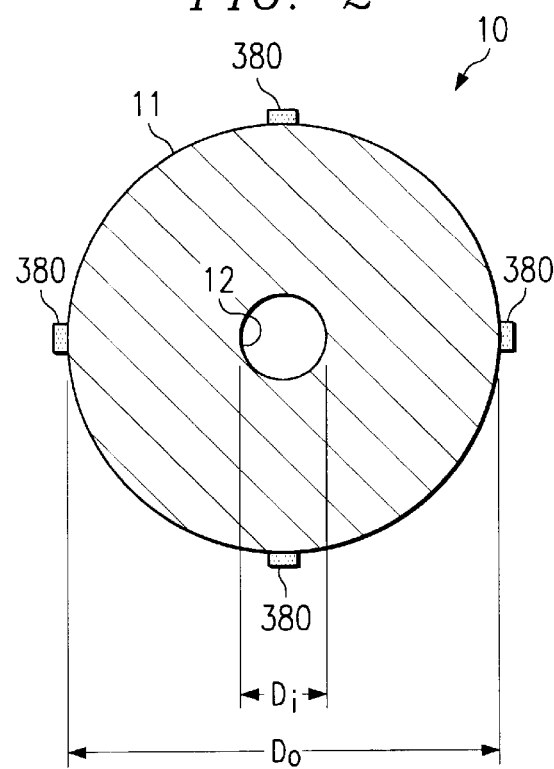
FIG. 2 is a cross section of the wire bonding capillary of claim 1 taken along line 2—2 of FIG. 1.

Preferably, shaft portion 20 is cylindrical in shape and has a circular cross section as shown more clearly in FIG. 2. However, other shapes may be used so long as the bonding wire may be threaded through the interior of capillary 10. For example, the capillary may have a rectangular or elliptical cross section. Preferably, the shaft portion 20 of capillary 10 is defined by a longitudinal bore of diameter $D_i$ and an outer surface having a cross-sectional diameter of $D_o$. Preferably, inner diameter $D_i$ is constant throughout an entire length of the bore of capillary 10. However, if capillary 10 has a constant wall thickness, then $D_i$ will vary according to changes in $D_o$.

Preferably, tip portion 30 is tapered downwardly and inwardly from a first point 31, where tip portion 30 meets shaft portion 20, to a second point 32 located at the exit end of capillary 10. Preferably, the outer diameter of tip portion 30 at first point 31 is equal to $D_o$ of shaft portion 20. Preferably, the outer diameter of tip portion 30 at second point 32 is a predetermined value which is less than the outer diameter at first point 31.

Capillary 10 may be formed from any suitable material. However, it is preferable that capillary 10 be formed from a high-strength material. For example, capillary 10 may be formed from a high-strength ceramic material.

A horn of a wire bonding machine is depicted in FIGS. 3 and 4. Horn 60 has a capillary mounting receptacle 61 for mounting capillary 10 as shown. Horn 60 also preferably includes a locking mechanism 62 for selectively locking capillary 10 into capillary mounting receptacle 61. Preferably, capillary 10 is freely rotatable about its longitudinal axis within mounting receptacle 61 when locking mechanism 62 is in the unlocked position.

Once capillary 10 is aligned according to a precise, predetermined initial alignment (e.g., so that the axis of the capillary face is aligned for X-direction bonding) it may be necessary to rotate capillary 10 about longitudinal axis AA by a precise angular amount. This may be necessary, for example, to align the axis of the capillary face along the Y-axis or in some other direction offset from either the X-axis or the Y-axis. For instance, a target lead might be oriented fifteen degrees offset counterclockwise from the X-axis. If the face of capillary 10 is initially aligned along the axis, then capillary 10 should be rotated precisely fifteen degrees counterclockwise (or 345 degrees clockwise) to ensure optimal bonding on the angularly offset target lead.

In accordance with the present invention, a device is provided to enable controlled stepwise rotation of the capillary in discrete incremental steps. A first part of the device is coupled to the capillary. A second part of the device is engageable with the first part to impart stepwise rotation to the capillary.

Figure 6:
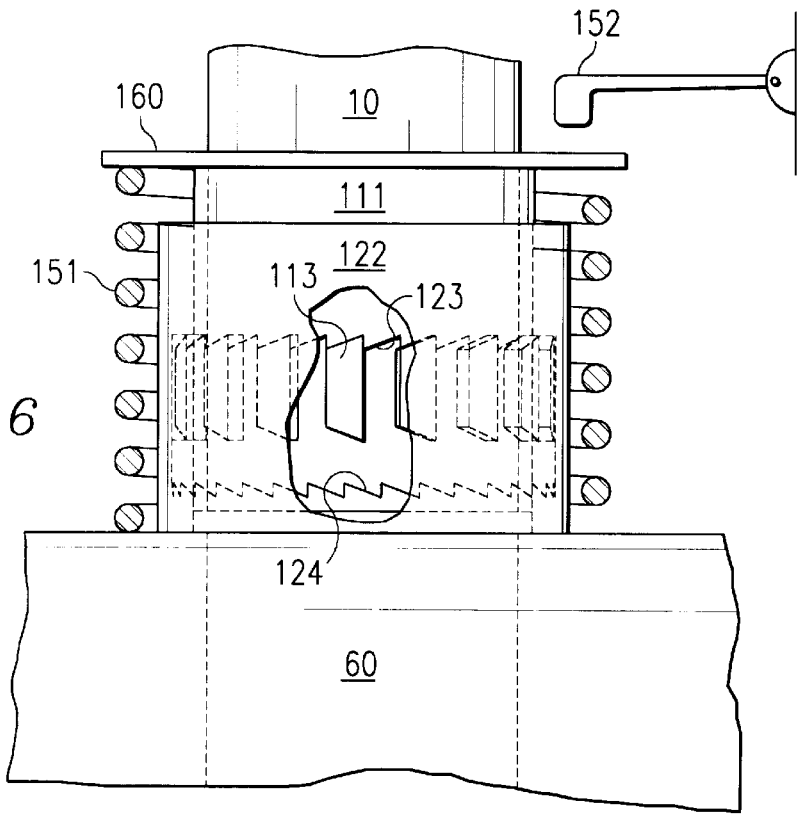
FIG. 6 shows a first position of the rotation device of FIG. 5.
Figure 7:
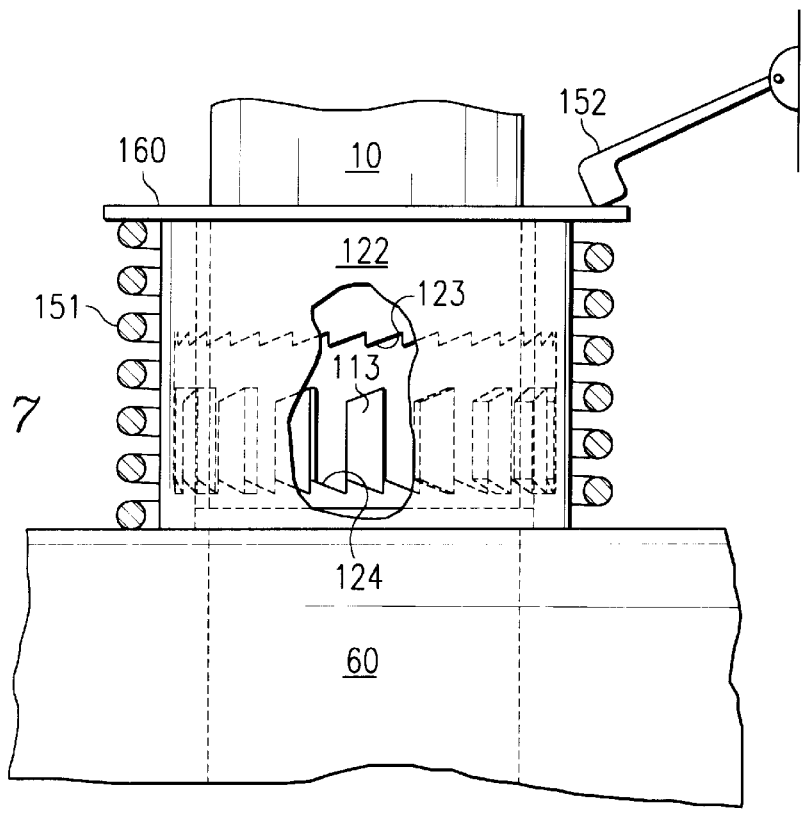
FIG. 7 shows a second position of the rotation device of FIGS. 5 and 6.

According to a first embodiment of the present invention, a device 100 for enabling precise, stepwise rotation of capillary 10 is depicted in FIGS. 5–7. As shown in FIG. 5, device 100 includes a first rotation element 110 and a second rotation element 120. Preferably, first and second rotation elements 110 and 120 cooperate with one another to impart stepwise rotation to capillary 10.

Preferably, first and second rotation elements 110 and 120 jointly form a click ring ratchet drive. It should be noted that other click ring configurations may be incorporated into the present invention. It should also be noted that stepwise multi-stable switches other than click rings may be incorporated into the present invention.

In accordance with the first embodiment, first rotation element 110 comprises a first ring 111 and second rotation element 120 comprises a second ring 122. First ring 111 has at least one projection 113 formed thereon. Preferably, first ring 111 has a plurality of projections 113 formed on an outer circumferential surface thereof and extending radially outward from the outer surface of first ring 111. Each projection 113 preferably comprises a tooth having two longitudinal sides 115 and 116 and two sloped transverse sides 117 and 118. First and second sloped transverse sides 117 and 118 join opposite ends of the longitudinal sides. Thus, first and second sloped transverse sides 117 and 118 have both a longitudinal component and a lateral component. Preferably, the sloped transverse sides 117 and 118 are sloped opposite one another. More preferably, the sloped transverse sides are sloped away from each other as they extend from first longitudinal side 115 toward second longitudinal side 116.

As shown in FIGS. 6 and 7, first rotation element 110 is mechanically coupled to an exterior surface of capillary 10. These two elements may be coupled together using any suitable bonding technique, such as adhesive bonding with consideration given to minimizing any interference with acoustical damping of the horn. Preferably, any bonding technique used will withstand the environmental conditions under which the capillary 10 will operate during the wire bonding process. Alternatively, first rotation element 110 may be integrally formed as a part of capillary 10. As described in greater detail below, the device 100 should be positioned along the longitudinal axis of capillary 10 such that when device 100 is in a release position, capillary 10 is in the correct position along its longitudinal axis to perform the wire bonding function.

Second ring 122 preferably interengages with first ring 111. Second ring 122 includes at least one notch to cooperate with the at least one projection 113 of first ring 111. Preferably the at least one notch is defined by a portion of a cavity 121 formed in the inner surface of second ring 122. Projections 113 extend radially outward from first ring 111 into cavity 121. Preferably, second ring 122 includes a plurality of first notches 123 and a plurality of second notches 124. First notches 123 are longitudinally spaced from second notches 124. Preferably, notches 123 and 124 are formed in an inner surface of second ring 122. The inner diameter of second ring 122 is formed to be slightly larger than the outer diameter of first ring 111. This allows second ring 122 to be fitted onto the exterior of first ring 111 as shown in FIGS. 6 and 7. Also first and second rings should be movable longitudinally with respect to each other.

Preferably, each notch 123 has a first edge 131 and a second edge 132. First edge 131 extends longitudinally. Second edge 132 is sloped and extends transversely. Thus, second edge 132 has both a longitudinal and a transverse component. First and second edges 131 and 132 meet at one end to form a limit of the respective notch 123. At the other ends thereof, first and second edges 131 and 132 form a notch opening. Preferably, the longitudinal component of second edge 132 is equal to the length of first edge 131. Also, the longitudinal component of second edge 132 is preferably equal to the longitudinal component of first sloped edge 117 of a projection 113. Further, the transverse component of second edge 132 is preferably equal in both length and direction to the transverse component of first sloped edge 117 of a projection 113. Thus, a first tip of a projection 113 fits snugly into a first notch 123.

Preferably, each second notch 124 has a first edge 141 and a second edge 142. First edge 141 extends longitudinally. Second edge 142 is sloped and extends transversely. Thus, second edge 142 has both a longitudinal and a transverse component. First and second edges 141 and 142 meet at one end to form a limit of the respective notch 124. At the other ends thereof, first and second edges 141 and 142 form a notch opening. Preferably, the longitudinal component of second edge 142 is equal to the length of first edge 141. Also, the longitudinal component of second edge 142 is preferably equal to the longitudinal component of second sloped edge 118 of a projection 113. Further, the transverse component of second edge 142 is preferably equal in both length and direction to the transverse component of second sloped edge 118 of a projection 113. Thus, a second tip of a projection 113 fits snugly into a second notch 124.

Preferably, first notches 123 are formed at predetermined intervals about the longitudinal axis of capillary 10. This will allow precise stepwise rotation of capillary 10. For example, first notches 123 may be positioned at every five, ten, forty-five or ninety degrees. When the interval is relatively small, there are more rotational positions available for rotation of capillary 10. In contrast, when the interval is relatively large, there are fewer rotational positions available. The intervals may be of any angular amount. Also, each interval can be the same or one interval can be of a different angular amount than another interval. The bonding process, the desired resolution/precision and the orientation of the lead frames and the leads will determine the angular intervals between first notches 123.

Preferably, second notches 124 are offset angularly offset from first notches 123. Otherwise, each second notch 124 should have dimensions corresponding to a respective, angularly adjacent first notch 123. The relative offset between first and second notches 123 and 124 provides a partial angular rotation during a click function as described further below. This allows the first tip of a projection 113 to be moved past an opening before a release function described below. Preferably, the length of second longitudinal side 116 of each projection 113 is small enough to allow rotational movement of projections 113 within cavity 121.

It should be noted that the first and second rotation elements described are merely an example of the click ring-type devices which may be used in accordance with the present invention. Other devices which provide detentes at stepwise intervals may be incorporated into the present invention. Also, it is not necessary, in all cases, that a first rotation element and a second rotation element be provided or, if provided, that the first rotation element be coupled to the capillary and the second rotation element be coupled to the horn. The specific components and their orientation will depend upon the stepwise rotation device selected.

Returning to the example provided in FIGS. 5–7, a first biasing mechanism 151 is provided to bias capillary 10 in a first longitudinal direction. Preferably, first biasing mechanism 151 comprises a spring which surrounds first and second rotation elements 110 and 120. One end of spring 151 abuts a surface horn 60. The other end of spring 151 abuts a click pad 160. Click pad 160 is preferably integral with first ring 111 and extends beyond the radial limits of first and second rings 111 and 122. Spring 151 tends to bias click pad 160 toward a release position. Thus, spring 151 biases projections 113 into first grooves 123. Preferably, first biasing mechanism 151, provides a continuous bias. That is, first biasing mechanism 151 continuously urges capillary 10 along the first longitudinal direction.

A second biasing mechanism 152 is provided for biasing the capillary in a second longitudinal direction (opposite the first longitudinal direction). Thus, second biasing mechanism 152 urges projections 113 into second grooves 124 against the continuous bias of first biasing mechanism 151. Preferably, second biasing mechanism provides a periodic bias. That is, second biasing mechanism only urges capillary 10 in the second longitudinal direction when second biasing mechanism is activated. This can occur at predetermined or selected time intervals or randomly. However, activation of second biasing mechanism 152 should only occur when rotation of capillary 10 is desired.

Cantilever 152 may be coupled to horn 60. Alternatively cantilever 152 may be coupled to another part of the wire bonding machine (not shown) or to a base separate from the wire bonding machine. Also, second biasing mechanism need not be a cantilever. Any device may be used which can provide the desired biasing force.

The operation of the rotation device 100 will now be described. It may be assumed, for example, that first notches 123 are spaced at five degree intervals. Capillary 10 is initially aligned with respect to a given axis, for example, the X-axis of the bonding platform of the wire bonding machine. A first bond is made, for example, at a first bond pad. It is then necessary to rotate the capillary so that the capillary face axis is aligned with the lead axis for the lead corresponding to the first bond pad. Assuming that the lead axis is offset from the X-axis by five degrees, for example, the capillary would be rotated by one click step (e.g., for five degrees of rotation). Then a bond would be made on the lead. The capillary might then be rotated back to the X-direction for the second bond pad. This could be accomplished by a sufficient number of clicks to rotate the capillary another 355 degrees. Subsequent realignment and bonding continue until all wire bonds have been made.

Initially, capillary 10 is in a release position such that second biasing mechanism 152 is not activated. Thus, first biasing mechanism 151 is free to urge the projections 113 into the first notches 123 as shown in FIG. 7. To rotate capillary 10 to the desired position, second biasing mechanism 152 is activated as shown in FIG. 6. Cantilever 152 pushes against click pad 160 against the force of spring 151. This moves projections 113 in the second longitudinal direction. A point along each second sloped edge 118 engages a respective opening end of a second edge 142 of a second notch 124. Due to the relative slopes of edges 118 and second edges 142 of second notches 124, rotation is imparted to projections 113 and, therefore, to capillary 10. Projections 113 continue to be forced in the second longitudinal direction until they reach the longitudinal limit of notches 124. At this point, the click function is complete and capillary 10 has only been rotated a portion of a five-degree interval. However, this partial rotation function is important because it sufficiently rotates each projection 113 past a respective notch 124. This ensures that during the following release function, projection 113 will be urged into a notch 123 adjacent to the notch 123 from which projection 113 exited at the start of the click function. If partial rotation was not provided, projections 113 would simply return to the same first notches 123.

During a following release step (FIG. 7), second biasing mechanism 152 is deactivated. Spring 151 is free to urge capillary 10 in the first longitudinal direction. First sloped edges 117 engage the opening ends of second edges 132 of first notches 123. The relative slopes of edges 117 and second edges 132 of notches 123 impart further rotation in the same direction as the partial rotation provided during the click step. Rotation continues until spring 151 has completely biased projections 113 into first notches 123. At this point, capillary 10 has been rotated a precise five degrees.

The click and release steps are repeated an additional seventeen times to complete the ninety-degree rotation. Then, horn 60 and/or the bonding platform may be manipulated to provide Y-direction bonding. It should be understood that the configuration and procedure described may be modified to provide any amount of desired stepwise rotation in either a clockwise or counterclockwise direction about the longitudinal axis of capillary 10. Also, it will be seen that a complete predetermined interval of rotation consists of the total of a first amount of rotation provided during the click step and a second amount of rotation provided during the release step. Thus, back and forth longitudinal movement of the capillary is translated into stepwise rotation of the capillary and a longitudinal force is translated into a rotational force.

A second embodiment of the present invention is depicted in FIGS. 8–11. A rotation device 200 includes a first rotation element and a second rotation element. The first rotation element is preferably a cam 211 and the second rotation element is preferably a roller 222. Cam 211 and roller 222 cooperate to provide precise stepwise rotation of capillary 10.

Figure 9:
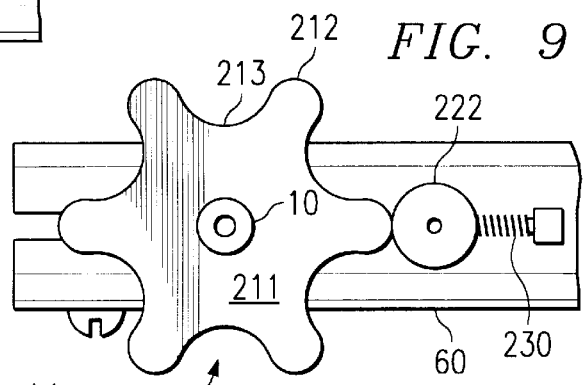
FIG. 9 is a top view of the rotation device of FIG. 8 viewed in the direction of arrows 9—9 in FIG. 8.

Cam 211 is coupled to capillary 10 by any suitable coupling technique such as adhesive bonding. Alternatively, cam 211 can be formed as an integral part of capillary 10. Preferably, cam 211 is coupled to, and surrounds, a central portion of capillary 10. As best seen in FIG. 9, cam 211 has a plurality of projections 212 interspersed between a plurality of grooves 213. Preferably, projections 212 and grooves 213 are smoothly joined and rounded so as to provide a smooth transition for roller 222. Preferably, roller 222 is rotatably mounted on a shaft 223. Shaft 223 is preferably coupled to horn 60 and is only movable back and forth along a longitudinal axis of horn 60. A biasing mechanism, such as a spring 230 is provided to bias roller 222 against cam 211.

Figure 8:
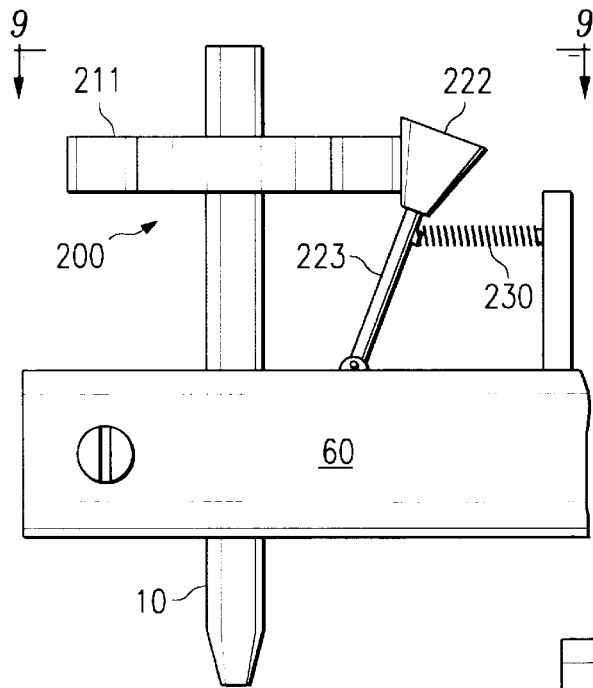
FIG. 8 shows a rotation device according to a second embodiment of the present invention and in a first position.

In an unstable position, as shown in FIGS. 8 and 9, cam 211 is oriented such that an outermost point on a projection 212 lies along a longitudinal axis of horn 60 and, therefore, contacts a respective point on roller 222. In this situation, spring 230 is compressed. This position is unstable. Due to the biasing force of spring 230, cam 211 will tend to rotate either clockwise or counterclockwise. Preferably, cam 211 is rotated, either automatically or by an operator, in a specific rotational direction depending upon the desired rotational alignment of capillary 10.

Figure 10:
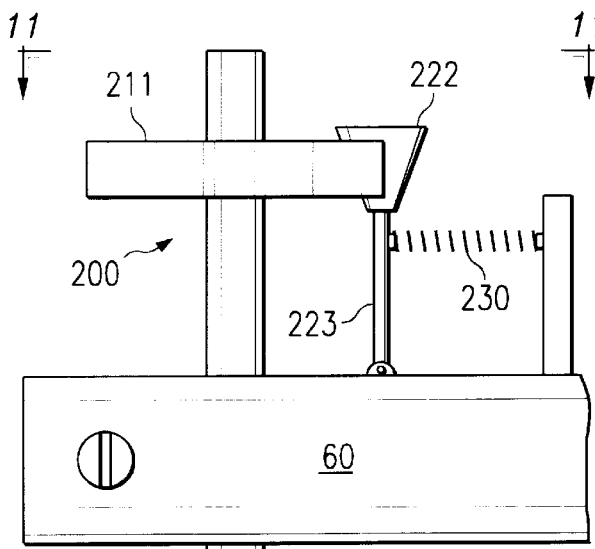
FIG. 10 shows a second position of the rotation device of FIGS. 8 and 9.
Figure 11:
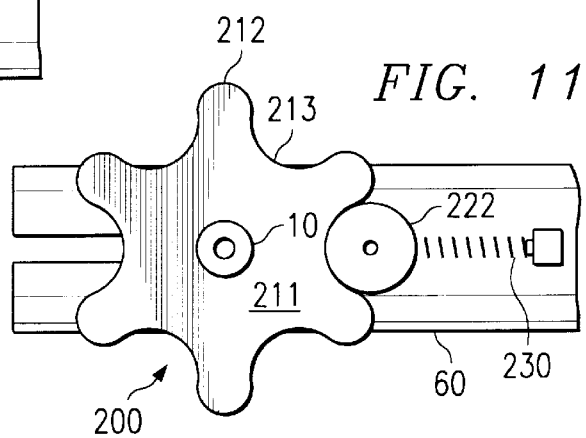
FIG. 11 is a top view of the rotation device of FIG. 10 viewed in the direction of arrows 11—11 in FIG. 10.

In a stable position, as shown in FIGS. 10 and 11, roller 222 is biased into a groove 213. In this situation, if no rotating force is applied to cam 211, then cam 211 will not tend to rotate on its own. Further, due to the biasing force of spring 230, and the fact that shaft 223 is only movable along the longitudinal axis of horn 60, roller 222 tends to resist rotation of cam 211. Thus, a certain amount of force is required to rotate cam 211 and cause roller 222 to move away from capillary 10. The individual components can be designed such that a specific, predetermined force is necessary to rotate cam 211 against the resistance of roller 222.

Preferably, grooves 213 are provided at predetermined intervals about the rotational axis of cam 211. For example, grooves 213 may be provided at every five degrees. The spacing will depend upon the amount of rotational resolution required by the application using rotation device 200. Preferably, at least one groove is aligned along an initial bonding axis and other grooves are aligned along other bonding axes of a lead frame undergoing the wire bonding process.

In operation, assuming five-degree spacing of grooves 213, capillary 10 is aligned according to a precise initial alignment. Roller 222 is biased fully into a groove 213 at this point. If rotation of ninety degrees is required, for example, cam 211 is rotated such that roller 222 moves away from and toward capillary 10 in eighteen cycles. Roller 222 will then be biased fully into a groove 213 corresponding precisely to a ninety-degree rotational alignment of capillary 10.

It should be noted that other types of cam arrangements may be used. For example, the cam and roller may be configured such that movement of roller 222 causes rotation of cam 211. Also, the locations of cam 211 and roller 222 may be switched. Thus, any type of cam device is acceptable so long as it provides multiple stable positions of rotation for capillary 10.

Figure 12:
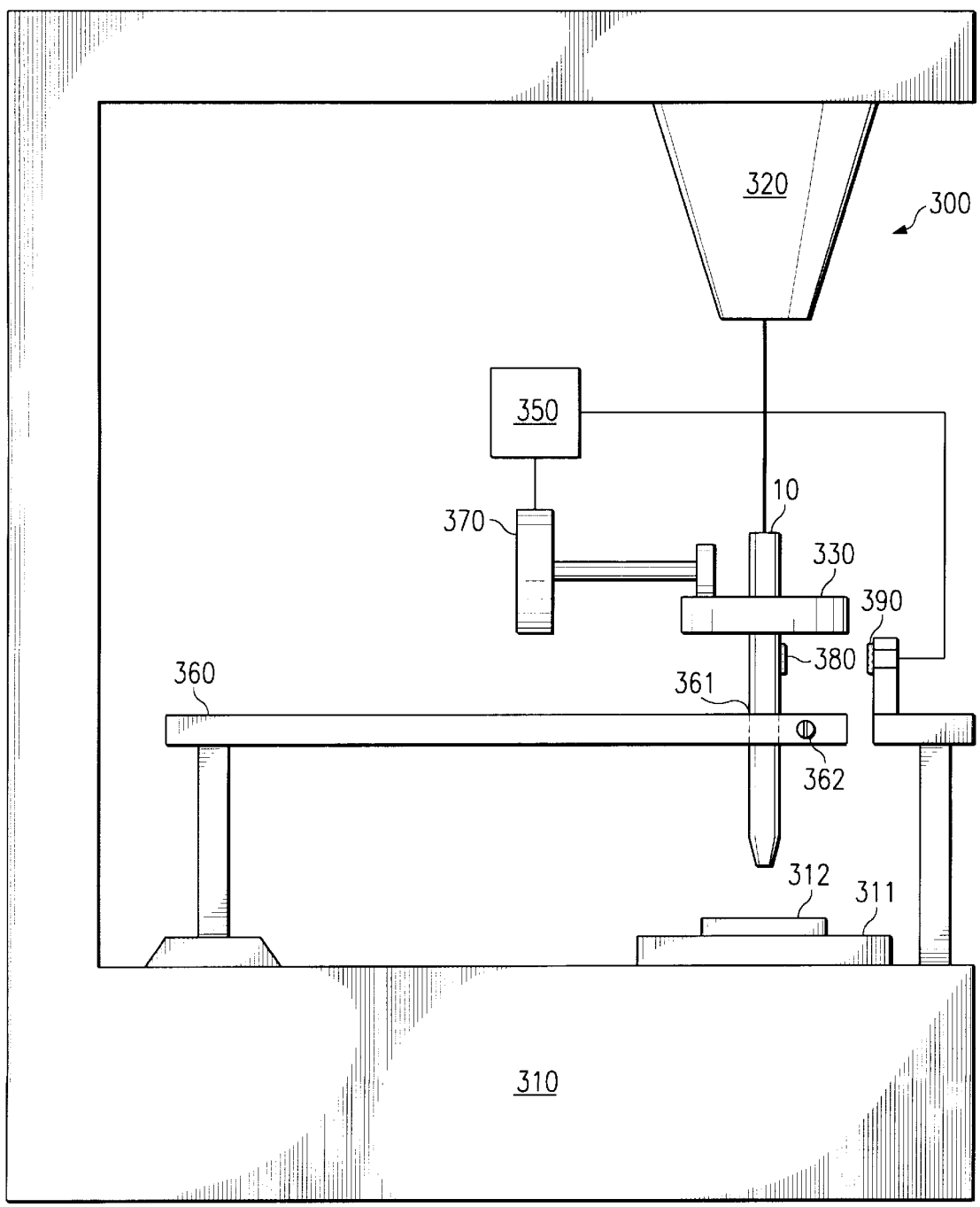
FIG. 12 shows a rotation device and a wire bonding machine in accordance with a third embodiment of the present invention.

According to a third embodiment of the present invention, as depicted in FIG. 12, the rotation device of the present invention (e.g., device 100 or device 200) may be incorporated into a wire bonding machine. Machine 300 comprises a body 310 having a mounting platform 311. Mounting platform 311 is adapted to receive a lead frame 312 for wire bonding. Machine 300 includes horn 360 attached thereto. Horn 360 has capillary 10 mounted in a mounting receptacle 361 thereof. Capillary 10 is rotatable with receptacle 361 as long as locking mechanism 362 is deactivated. Horn 360 may be manipulated to wire bond lead frame 312. Machine 300 also includes a source (e.g., a spool) of bonding wire 320 mounted thereon. The bonding wire may be threaded through capillary 10 and used to complete wire bonds on the lead frame.

The rotation device is at least partially coupled to capillary 10. Preferably, a first part of rotation device 330 is coupled to capillary 10 and a second part of rotation device 330 is separate from capillary 10 but engageable with the first part. The second part of rotation device 330 may be coupled to, or engage, horn 360.

The first part of rotation device 330 is engageable with the second part to impart stepwise rotation to the capillary. Preferably, longitudinal movement of the first and second parts toward each other causes the first part to rotate relative to the second part.

According to a feature of the present invention, capillary 10 may have one or more first indicators incorporated into the body thereof to provide one or more signals to one or more detectors. The indicators may be of any type including active, passive, mechanical, electrical, optical, magnetic, and others. Additionally, one or more second indicators may be provided to cooperate with the one or more first indicators on capillary 10. For example, in the arrangement shown FIG. 12, a first indicator (e.g., indicator 380) may comprise, for example, reflective markings. The markings may be optically detected. Preferably, at least one marking is aligned with the axis of the face of capillary 10. A detector (e.g., a transducer 390) may detect the indicator and produce a corresponding detection signal. Preferably, the indicator and transducer are positioned such that when transducer 390 detects the indicator, the axis of the face of capillary 10 is precisely aligned in the desired direction of bonding (e.g., along the X-axis or Y-axis, or offset by a precise amount). The electrical signal from transducer 390 may be passed to a display (not shown) to indicate that capillary 10 is properly aligned.

Thus, the indicators provide signals, which may be detected and used to determine the rotational position of capillary 10. Alternatively, the indicators may provide a signal which is received by a detector. The signal may have a relative signal strength. For example, the signal may be stronger when the first indicator and a detector are in a closest proximity to one another. The signal may weaken as these two elements are separated by rotation of capillary 10. The strength of the sensed signal would indicate an amount of angular offset from a predetermined rotational alignment of capillary 10.

The indicators 380 and detector 390 are preferably used to establish precise initial alignment of the capillary 10 and the rotation device 100 with respect to horn 360 and/or the bonding platform or lead frames. After initial alignment, and during the wire bonding process, precise rotation is preferably provided by the stepwise rotation device (e.g., device 100 or 200) as described above. Indicators 380 and detector 390 may be used during wire bonding to confirm the proper desired rotational alignment of capillary 10.

According to another feature of the present invention, rotation and alignment may be completely controlled by a computer, such as computer 350 shown in FIG. 12. In the example shown, rotation device 330 is a click ring. However, any rotation device according to the present invention may be used. In the example of a click ring, computer 350 determines the desired rotational position of the capillary. This can be established based on a predetermined configuration of a lead frame.

Preferably, the computer sends a message which activates a power source 370 which activates a cantilever, causing the cantilever to engage a click pad of rotation device 330. A counting device (not shown) may be included to count the number of click-and-release cycles of the click ring. Precise rotation is achieved when a number of cycles has been performed which corresponds to the rotational alignment needed to align an axis of the capillary face along the desired direction. This direction may change from one bonding point to another. Therefore, the computer would control the alignment and realignment accordingly.

Optionally, when the indicators provide a signal to a detector that indicate capillary 10 has reached the desired rotational position, the detectors provide input to the computer. The computer sends a deactivation message to the rotation device and the wire bonding machine may then proceed with bonding.

According to an aspect of this feature, other sensing devices are provided to sense the orientation of each respective lead directly. This may be accomplished, for example, by known scanning techniques. This information is transmitted to the computer, which may send a corresponding activation message to the rotation device. The rotation device rotates the capillary to an exact position based on the orientation of a particular lead, as opposed to a predetermined orientation of a lead frame stored in the computer memory.

The present invention has thus been described in connection with the preferred embodiments, which are intended as examples only. It will be appreciated by those having ordinary skill in the relevant art that modifications may be made to these embodiments without departing from the scope and spirit of the invention as defined by the appended claims.

What is claimed is:

1. An apparatus for rotating a wire bonding capillary, the apparatus comprising:

a first part adapted to be coupled to the capillary; and a second part engageable with the first part to impart stepwise rotation to the capillary;

the first part comprising a first rotation element, the second part comprising a second rotation element cooperative with the first rotation element to impart stepwise rotation to the capillary;

wherein the first and second rotation elements form a click ring ratchet drive.

2. An apparatus for rotating a wire bonding capillary, the apparatus comprising:

a first part adapted to be coupled to the capillary; and a second part engageable with the first part to impart stepwise rotation to the capillarly;

the first part comprising a first rotation element, the second part comprising a second rotation element cooperative with the first rotation element to impart stepwise rotation to the capillary;

one of the first and second rotation elements comprising a first ring having at least one projection, the other of the first and second rotation elements comprising a second ring having at least one groove for receiving the at least one projection.

3. An apparatus for rotating a wire bonding capillary, the apparatus comprising:

a first part adapted to be coupled to the capillary; and a second part engageable with the first part to impart stepwise rotation to the capillary;

the first part comprising a first rotation element, the second part comprising a second rotation element cooperative with the first rotation element to impart stepwise rotation to the capillary;

further comprising a first biasing mechanism for biasing the capillary in a first direction along a longitudinal axis of the capillary.

4. The apparatus of claim 3, wherein when the first biasing mechanism biases the capillary, the first rotation element rotates a first amount relative to the second rotation element.

5. The apparatus of claim 4, further comprising a second biasing mechanism for biasing the capillary in a second direction along the longitudinal axis of the capillary, wherein when the second biasing mechanism biases the capillary after the first biasing mechanism biases the capillary, the first rotation element rotates a second amount relative to the second rotation element.

6. The apparatus of claim 5, wherein the first and second amounts of rotation are in the same rotational direction about the longitudinal axis of the capillary, and wherein the first and second amounts total a predetermined interval of rotation.

7. The apparatus of claim 3, wherein the first biasing mechanism continuously biases the capillary.

8. The apparatus of claim 3, wherein the first biasing mechanism periodically biasing the capillary.

9. An apparatus for rotating a wire bonding capillary, the apparatus comprising:

a first part adapted to be coupled to the capillary; and a second part engageable with the first part to impart stepwise rotation to the capillary;

the first part comprising a first rotation element, the second part comprising a second rotation element cooperative with the first rotation element to impart stepwise rotation to the capillary;

wherein the first rotation element comprises a cam.

10. The apparatus of claim 9, wherein the second rotation element comprises a roller.

11. The apparatus of claim 10, further comprising a biasing mechanism for biasing the roller against the cam.

12. An apparatus for rotating a wire bonding capillary, the apparatus comprising:

a first part adapted to be coupled to the capillary; and a second part engageable with the first part to impart stepwise rotation to the capillary;

the first part comprising a first rotation element, the second part comprising a second rotation element cooperative with the first rotation element to impart stepwise rotation to the capillary;

wherein the first rotation element comprises a cam;

wherein the cam comprises a plurality of projections interspersed between a plurality of grooves.

* * * * *